United States Patent
Keller

(10) Patent No.: US 8,310,347 B2
(45) Date of Patent: Nov. 13, 2012

(54) INCREMENTING COUNTER WITH EXTENDED WRITE ENDURANCE

(75) Inventor: Christian Keller, Moosinning (DE)

(73) Assignee: Texas Instruments Deutschland GmbH, Freising (DE)

(*) Notice: Subject to any disclaimer, the term of this patent is extended or adjusted under 35 U.S.C. 154(b) by 940 days.

(21) Appl. No.: 12/388,265

(22) Filed: Feb. 18, 2009

(65) Prior Publication Data

US 2009/0206991 A1 Aug. 20, 2009

Related U.S. Application Data

(60) Provisional application No. 61/141,846, filed on Dec. 31, 2008.

(30) Foreign Application Priority Data

Feb. 19, 2008 (DE) .......................... 10 2008 009 768

(51) Int. Cl.
*H04Q 5/22* (2006.01)
*G05B 19/00* (2006.01)
*G05B 23/00* (2006.01)
*G06F 13/00* (2006.01)
*G06F 7/04* (2006.01)

(52) U.S. Cl. .............. 340/10.52; 340/5.72; 340/10.51; 340/5.27; 340/5.42; 711/156; 711/163; 711/164; 726/26

(58) Field of Classification Search ............ 340/5.72, 340/10.52, 5.74, 5.42, 5.26, 5.27, 5.2, 10.51; 711/156, 163, 164; 726/26
See application file for complete search history.

(56) References Cited

U.S. PATENT DOCUMENTS

| 3,883,853 | A | * | 5/1975 | O'Brien et al. | 711/4 |
| 4,803,707 | A | * | 2/1989 | Cordan, Jr. | 377/24.1 |
| 5,903,410 | A | * | 5/1999 | Blaum et al. | 360/77.08 |
| 6,601,158 | B1 | * | 7/2003 | Abbott et al. | 711/220 |
| 7,472,233 | B2 | * | 12/2008 | McKenney et al. | 711/147 |
| 7,552,272 | B2 | * | 6/2009 | Gonzalez et al. | 711/103 |
| 7,652,904 | B2 | * | 1/2010 | Dono et al. | 365/51 |
| 2007/0130412 | A1 | * | 6/2007 | Liou | 711/5 |
| 2008/0158948 | A1 | * | 7/2008 | Sharon et al. | 365/185.02 |
| 2011/0010509 | A1 | * | 1/2011 | Flores et al. | 711/154 |

* cited by examiner

*Primary Examiner* — Benjamin C Lee
*Assistant Examiner* — Christopher Gaines
(74) *Attorney, Agent, or Firm* — William B. Kempler; Wade J. Brady, III; Frederick J. Telecky, Jr.

(57) ABSTRACT

A method and device for writing a binary count of a length n to a memory having a limited number of write cycles, a physical storage location of bits (R-bits) of the count in the memory are periodically changed, fixed bits of the count are stored at fixed physical storage locations, and a bit value pattern of the fixed bits is used as an indicator for the physical storage locations of the changing bits (R-bits).

20 Claims, 4 Drawing Sheets

INCREMENTING COUNTER WITH EXTENDED WRITE ENDURANCE

This patent application claims priority from German Patent Application No. 10 2008 009 768.3, filed 19 Feb. 2008, and from U.S. Provisional Patent Application No. 61/141,846, filed 31 Dec. 2008, the entireties of which are incorporated herein by reference.

FIELD OF THE INVENTION

The present invention generally relates to a method and device for writing a binary count to a memory having a limited number of write cycles. More particularly, the present invention relates to an incrementing counter with extended write endurance.

BACKGROUND OF THE INVENTION

In many applications, devices with memories are used in order to store a value of a counter for a certain amount of time. For example, a wireless car key with an RF transmitter has an internal memory. Every time the key is used, an internal counter in the key is incremented. The internal count in the key is encrypted and the encrypted count is sent to the car for being compared with a corresponding count generated and stored in a memory in the car. The counts stored in the key and in the car are compared every time the key is used. If the counts are not within a certain range, the car cannot be opened with the key anymore and a synchronization has to be performed. This provides additional safety against copying of wireless car keys. A major problem lies in the limited write cycles of the memory in the key. Typically, EEPROMs are used as they are non-volatile, but they withstand only several thousands up to several hundreds of thousands of write cycles. When the maximum number of write cycles is reached, the device using the memory, i.e. e.g. the wireless car key ceases functioning properly. In order to avoid premature failure of the key, the memory in the key is typically redundant, i.e. there is more memory than required by the mere bit length of the count. However, this approach increases costs. Therefore, there is a general desire to increase endurance of the memory by a certain factor, sufficient for most applications.

Just as an illustrative example, a count may be stored as a 32 bit or 4 byte word in a memory. In a straightforward approach to writing the count in the memory, every time the key is used 32 bits would be erased and written anew into the memory. However, for binary numerals, only the least significant bit toggles every time the count value is increased by one. Therefore, the position in the memory where the LSB of the 32 bit word is saved has the highest change or write burden. Thus, the bits with the higher write burden are exchanged periodically with bits having a lower write burden (more or most significant bits or MSBs). The bits that do not change are simply maintained. This saves write cycles of the memory in the locations where no change occurs. However, if the memory locations are exchanged, additional information is needed as to how and where the specific bits of the count are located after the change. Existing solutions add some additional bits to the number of bits necessary for the count. For example, if the count has 32 bits, then four additional bits may be used for indicating sixteen different configurations as to where the specific bits of the count are located after a change. However, this approach increases the size of the memory needed and thereby the costs of the respective products.

SUMMARY OF THE INVENTION

One aspect of the present invention provides a method for writing a binary count of a length N to a memory having a limited number of write cycles. The method comprises periodically changing a physical storage location of bits (R-bits) of the count in the memory, storing fixed bits of the count at fixed physical storage locations, and using a bit value pattern of the fixed bits as an indicator for the physical storage locations of the changing bits (R-bits). Therefore, instead of using additional bits further to those necessary for storing the count, as was required by previous solutions, one aspect of the invention allocates certain bits of the count that are always fixed, or stored in the same physical storage locations. The position of these fixed bits in the count is then used to indicate the physical location in the memory where the changing bits are stored. Exchanging the position of bits in the count according to the present invention enhances the effective write endurance of the memory without the need for additional non-volatile memory. Therefore, the size of the memory needed is reduced compared to existing solutions, since the indicator of the memory locations of the changing bits is provided by bits in the count itself.

In one aspect, the number of fixed bits is greater than or equal to the logarithm to base two of the number of different position patterns of the changing bits of the whole count. This minimum number of fixed bits can be used in order to have sufficient information for the necessary bit exchanges, in view of an acceptable prolongation of the lifetime of the memory.

The changing bits can be grouped into allocation units, with the minimum number of allocation units being two. Changing of the bits is then able to be performed with entire allocation units. This aspect is helpful as the limited number of fixed bits allows only a limited number of different patterns of the rotating or changing bits. Using allocation units instead of single bits reduces the number of possible locations.

The significance (i.e. the position within the count from LSB to MSB) may be selected with special care. The fixed bit should not be the least significant bit of a count, otherwise it would toggle in each write cycle. According to an aspect of the invention, the lowest significant fixed bit can have a significance within the count which is greater than the logarithm to the base two of the number of different patterns of the changing bits.

In one aspect of the invention, the count can have a bit length of n=32. The length of an allocation unit can be seven bits and the fixed bits can be the bits at positions 7, 15, 23 and 31. In this configuration the bit pattern of the fixed bits at positions 7 and 15 in the word can be used to indicate the respective physical storage locations of the allocation units. Physical storage locations of the changing bits may be changed approximately every 128 write cycles of the memory. This means that all the physical storage locations of the memory are used approximately equally, which increases the overall write endurance of the memory.

The position of the changing bits may be changed by either exchanging the position of a changing bit with that of another changing bit, or by changing the physical storage location of the changing bit to a memory location that is not yet or no more used by the count. This is for example the case with more significant positions of the count (MSBs), if the count is still very small. The LSBs may then be written to storage locations, where MSBs are to be stored, once they are set. Alternatively or additionally, the positions of allocation units may be changed or exchanged.

An aspect of the present invention also provides an electronic device having circuitry for writing a binary count of a length N to a memory with a limited number of write cycles. The circuitry is adapted to periodically change physical storage locations of bits (R-bits) of a count stored in the memory and to write fixed bits of the count to fixed physical storage locations. Furthermore, the circuitry is also adapted to use a bit value pattern of the fixed bits as an indicator for the position of the respective physical storage locations of the changing bits (R-bits). The memory can be an EEPROM and is divided into physical storage locations. Since the physical storage locations of the bits are changed periodically, the write burden of the memory is significantly decreased and its lifetime is increased. Furthermore, since the indicator of the physical storage locations of the changing bits is provided by a pattern of fixed bits in the count itself, no extra memory is required to indicate the positions of the bits after they have changed. Therefore, the size of the memory does not have to be increased, or space in the memory may be entirely devoted just to storing the count itself.

In one aspect, the number of fixed bits is equal to or greater than the logarithm to base two of the number of different position patterns of the changing bits over the whole account. This minimum number of fixed bits may then be used to provide sufficient information for the necessary exchanges of bits in view of how long it is desired to prolong the lifetime of the memory. However, as will be shown hereinbelow, the number of fixed bits can also be greater than the logarithm to base two, if this is useful in terms of allocation units, symmetry or other reasons.

In one aspect of the invention, the fixed bits can be used as control signals for a multiplexer. These control signals control the multiplexer to write bits of the count from the correct physical storage location to the memory. Therefore, the electronic device can include a specific number of multiplexers relating to the number of changing bits and the number of multiplexing actions (changes) to be performed. Advantageously, the fixed bits are used as the control or configuration signals for the multiplexer or multiplexers. This aspect of the invention provides for a very efficient and simple implementation. Specific bit locations of the memory are then coupled to the control inputs of one or more multiplexers. A change of the fixed bits will then change the output of the multiplexer. As a count is read from a written to a memory, two similar multiplexer arrangements can be provided around the memory. A first stage of multiplexers would then preferably be used for reading from the memory and a second stage of multiplexers would be used for writing to the memory. The multiplexers can all be controlled by the fixed bits. The output of the first stage and the input of the second stage could be coupled to the counter or additional logic circuitry. If this aspect of the invention is properly implemented, the counter or the additional external logic can remain unaware of any changing of the bits. Therefore, the present invention allows use of the same unmodified counters and logic as used in prior art solutions.

The invention is generally advantageous for radio frequency identification (RFID) devices and RFID technology, if memory is used. For example, a wireless car key can be implemented by use of RFID technology. Accordingly, the invention also generally provides an RFID tag. The RFID tag comprises an electronic device having circuitry for writing a binary count of length N to a memory with a limited number of write cycles. The circuitry is adapted to periodically change physical storage locations of bits (R-bits) of the count stored in the memory and to write fixed bits of the count to fixed physical storage locations. The circuitry is further adapted to use a bit value pattern of the fixed bits as an indicator for the position of the respective physical storage locations of the changing bits (R-bits). This RFID tag may be implemented in an RFID system, which also has a read-write unit adapted to communicate with the RFID tag.

The invention also provides a vehicle locking system comprising an electronic device having circuitry for writing a binary count of length N to a memory with a limited number of write cycles. The circuitry is further adapted to periodically change physical storage locations of bits (R-bits) of the count stored in the memory and to write fixed bits of the count to fixed physical storage locations. Furthermore, the circuitry can use a bit value pattern of fixed bits as an indicator for the position of the respective physical storage locations of the changing bits (R-bits). Thus, in the vehicle locking system of the present invention, the memory lifetime is increased and also the size of the memory required is reduced, since the position of the changing bits is indicated by fixed bits in the count itself and not by a separate indicator. The electronic device in the vehicle locking system may be located both in a key for locking the vehicle and also in the vehicle itself such that the vehicle can only be opened when the count stored in the memory of the device in the key is the same or close enough to the count (i.e. within a predefined tolerance range) stored in the memory of the device in the vehicle. If the counts are too far from each other, then the vehicle will not be able to be opened. This protects against copying of the key in the vehicle locking system.

The invention also provides a car key, comprising an electronic device having a circuitry for writing a binary count of a length N to a memory with a limited number of write cycles. The circuitry is adapted to periodically change physical storage locations of bits (R-bits) of the count stored in the memory and to write fixed bits of the count to fixed physical storage locations. Further, the circuitry is adapted to use a bit value pattern of the fixed bits as an indicator for the position of the respective physical storage locations of the changing bits (R-bits). The lifetime of the memory in the car key is then extended because its write endurance is increased. Furthermore, no additional non-volatile memory is needed to store the positions of the physical storage locations of the changing bits, since this is done by the pattern of the fixed bits in the count itself.

The invention also provides a method of configuring an electronic device for writing a binary count of length N to a memory with a limited number of write cycles. The method comprises providing a counter, a memory and circuitry for writing the binary count from the counter to the memory and coupling the counter and the memory to the circuitry. The method also comprises adapting the circuitry to be capable of periodically changing the physical storage locations of bits (R-bits) of the count stored in the memory and to write fixed bits of the count to fixed physical storage locations. The circuitry is further adapted to be able to use a bit value pattern of the fixed bits as an indicator for the position of the respective physical storage locations of the changing bits. The electronic device is thus designed so that no additional non-volatile memory is required to store the positions of the changing bits, therefore the size of the required memory is reduced.

Although the invention was described with respect to specific applications, the above aspects of the invention are generally useful for all electronic devices with integrated memory and the invention is therefore not limited to any specific application.

BRIEF DESCRIPTION OF THE DRAWINGS

Further advantages and characteristics of the invention ensue from the description below of the preferred embodiments, and from the accompanying drawings, in which:

FIGS. 2A and 2B show a table with a bit pattern according to a preferred embodiment of the invention.

DETAILED DESCRIPTION OF EXAMPLE EMBODIMENTS

Figure 1:
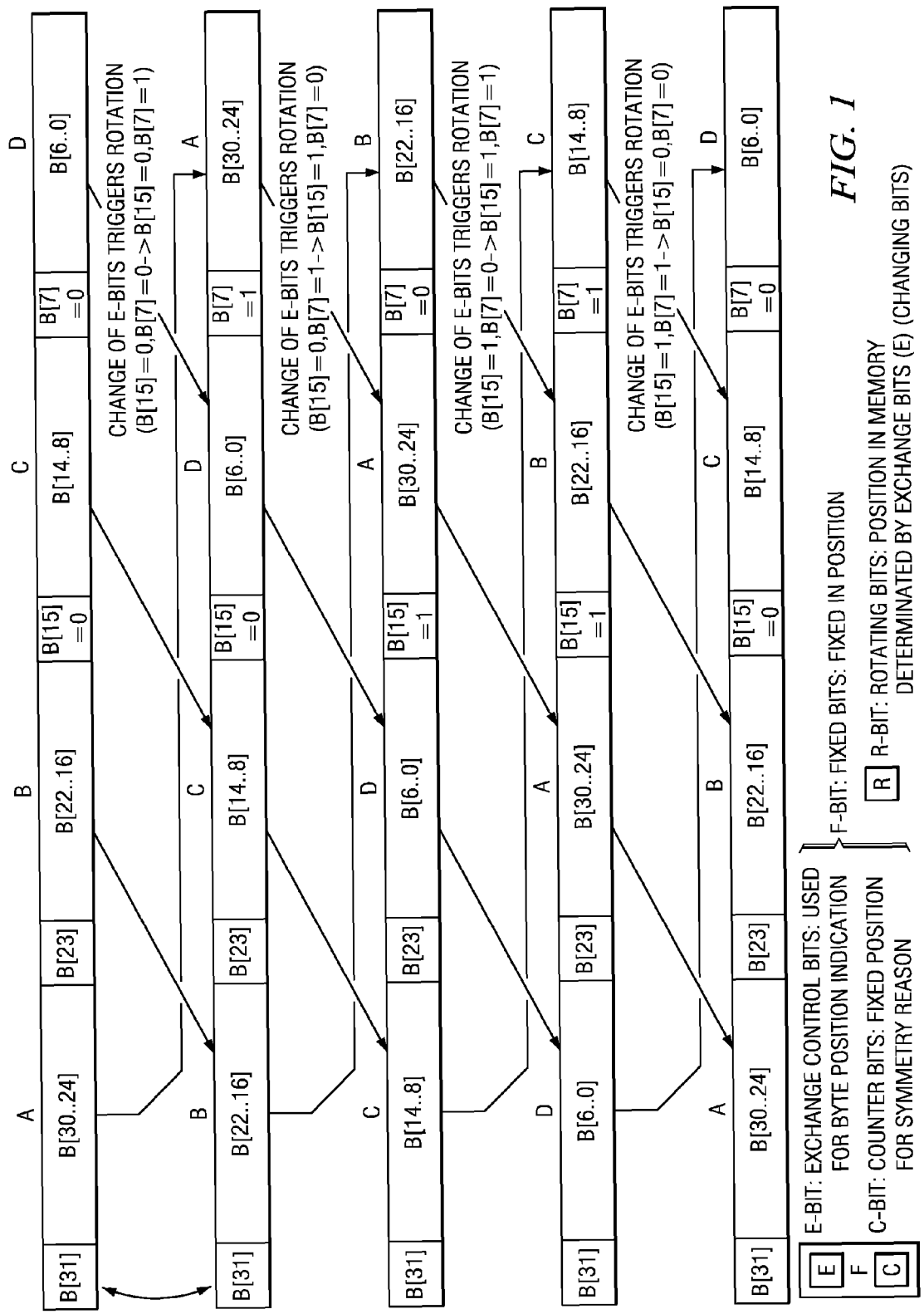
FIG. 1 is a simplified block diagram of the method according to the invention.

FIG. 1 shows a simplified schematic block diagram illustrating the method according to the invention for a 32-bit counter. Each horizontal block in FIG. 1 represents different write cycles to the memory of the device and a corresponding use of the memory. The horizontal blocks in FIG. 1 represent the way of periodically changing the physical storage location of bits of the count in the memory, where the fixed physical storage locations can be located for storing the fixed bits, and how the bit value pattern of the fixed bits can be used as an indicator for the physical storage locations of the changing bits. It is assumed that an incremental counter starts counting up from zero. Every time the count increments by one, circuitry coupled to the counter writes the binary count to the 32 bits of memory represented by the horizontal blocks in FIG. 1 and the memory stores the binary count from the counter. The length of the count is divided into allocation units A, B, C, and D, with each allocation unit being seven bits long. The start and end of allocation unit A is indicated by counter bits B[31] and B[23] (i.e. with significance 2^31 and 2^23), respectively, the start and end of allocation unit B is indicated by counter bits B[23] and exchange control bit B[15] (i.e. with significance 2^23 and 2^15). The start and end of allocation unit C is indicated by the exchange control bit B[15] and B[7] (i.e. with significance 2^15 and 2^7), respectively. The start of allocation unit D is indicated by the exchange control bit B[7]. Both of the counter bits, B[31] and B[23], and the exchange control bits B[15] and B[7] are fixed bits of the counter value, which are stored at fixed physical locations of the memory. Bits in the allocation units A, B, C and D are changing, or rotational, bits (R-bits). The number of exchange control bits required is determined by the number of exchange positions, i.e. the number of different patterns of the changing bits. In the present example, two fixed bits B[15], B[7] are used as indicator of the bit pattern of the changing bits. The two bits can indicate four different patterns, which is equal to the logarithm to base two of the number of patterns or exchange positions in the present example. Depending on the required minimum number, some counter bits may be required for symmetry, in order to fill up the fixed bits to make a byte. Therefore, bits B[23], and B[31] are also fixed bits, but they are not used as pattern indicator. The exchange control bits B[15], B[7] can be located within the memory bytes involved in the exchange or in separate bytes of the memory which is currently not used but still part of the required minimum memory for storing the count. The binary interpretation of the exchange control bits directly indicates the position of the memory cell containing the least significant R-bits. The positions of the other R-bits may then be calculated subsequently from this position.

After a certain number of write cycles of the memory, for example 128, positions in the bits of the allocation units are periodically changed, for example, in the most simple exchange algorithm to the position of the consecutive allocation unit, as shown in FIG. 1. Toggling of the exchange control bit B[7] from 1 to 0 or from 0 to 1 triggers a change in physical location of the allocation unit. For example, at first the allocation unit D, containing the least significant bit is to the far right position, then the allocation unit D with the least significant bit changes position to that where the allocation unit C was previously located, upon a change in value of the exchange control bit B[7] from 0 to 1. With each change of the exchange control bits, all bytes within the memory are written. In between, only the byte containing the least significant bits is updated. The least significant bits are incremented in four different memory positions 127 times. This bit exchange algorithm may be implemented either in hardware or software. In this way, every physical storage location of the memory (or every allocation unit) can be used for approximately the same number of write cycles of the memory, and so the life time of the memory is increased. In this particular example, the write burden is 127+4 memory writes on 512 increments for each byte of memory. This leads to an increase in write endurance by a factor of 3.908.

Figure 2A:
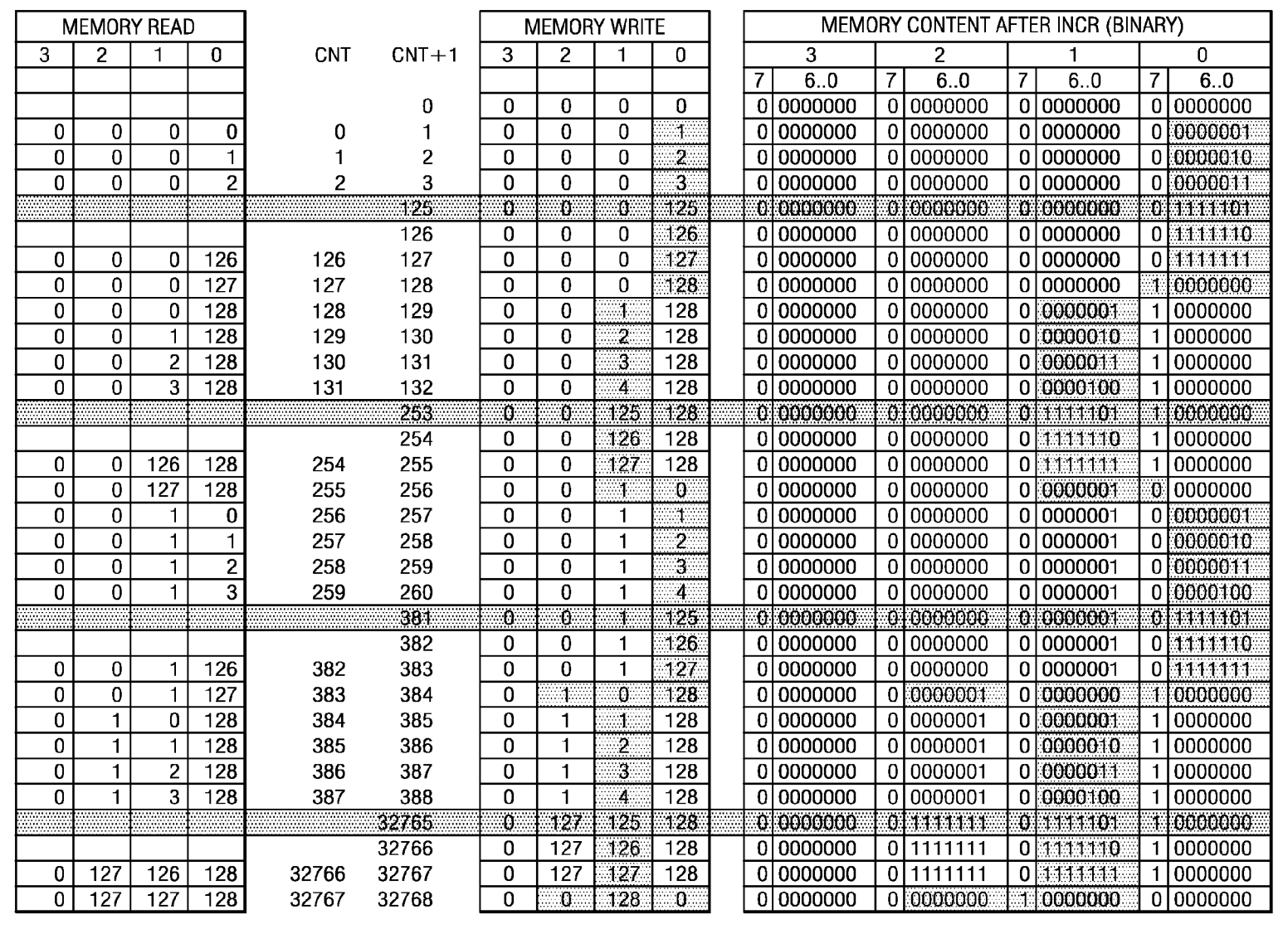
Figure 2B:
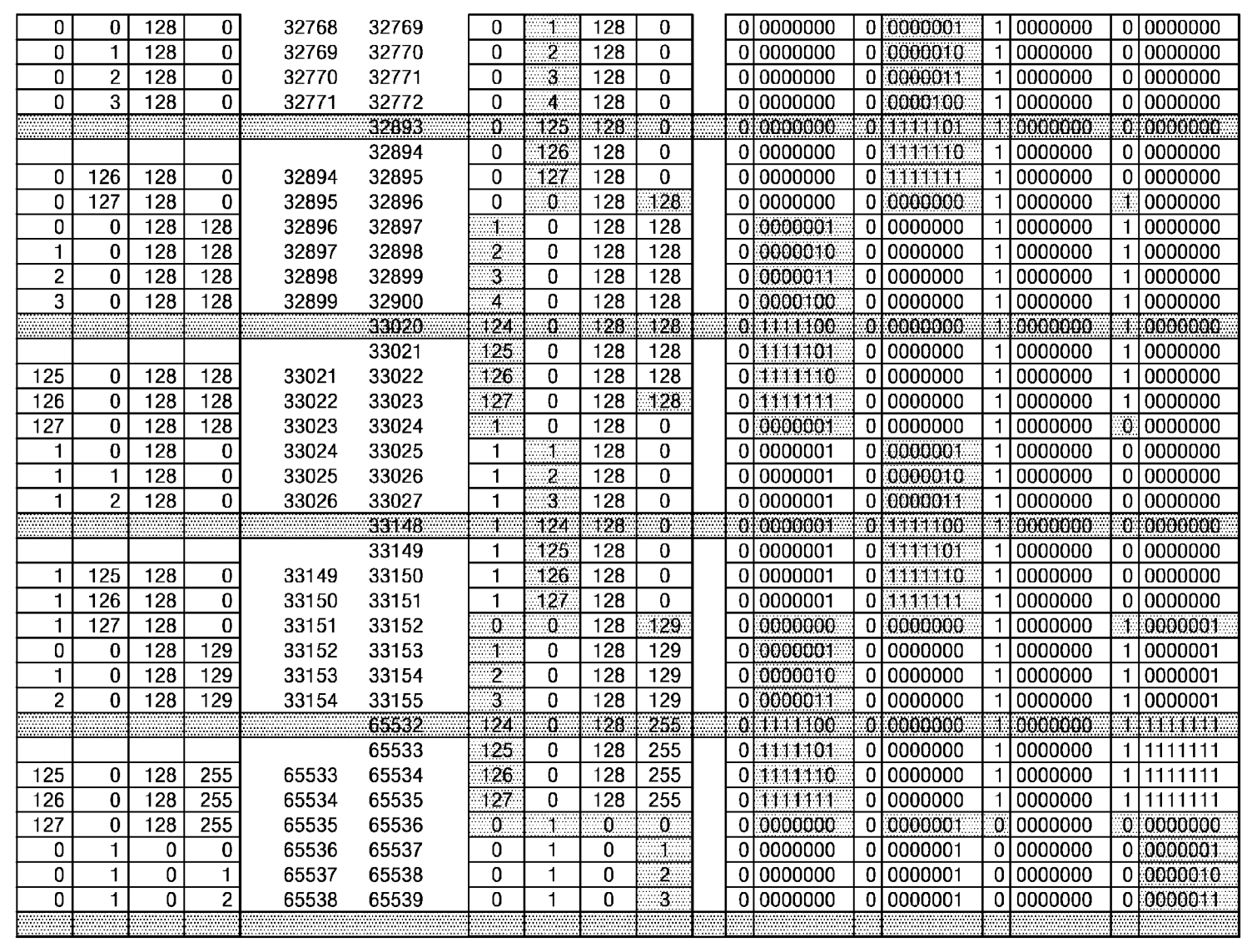

FIGS. 2A and 2B show the bit pattern in the memory as the counter in the device according to the invention is incremented according to another preferred embodiment of the invention. Not all write cycles of the count are shown in FIGS. 2A and 2B, since there are a very large number of write cycles over the whole count. The exchange algorithm shown in the table in FIGS. 2A and 2B results in the most efficient use of memory over all write cycles of the whole count. The table starts in FIG. 2A and continues in FIG. 2B.

The columns titled CNT and CNT+1 show the count of a 32 bit counter, with fixed bits at positions [7], [15], [23] and [31] similar to the embodiment shown in FIG. 1. However, FIG. 2 is useful to better understand the specific way of changing storage locations with the changing bits [0] to [6], [8] to [14], [16] to [22] and [24] to [30].

The previous counter value CNT is read from the memory and stored in the counter (or the counter is set to the count CNT). Each row of the table represents a step including a memory read, an increase of the counter by one and a memory write. The table shows the number of write and read cycles as well as the memory contents. The count CNT is increased by 1 and the increased value CNT+1 is written back to the same memory, thereby overwriting the previous memory content, if the value of an allocation unit (7 LSBs of a byte) has changed. The current memory content is indicated in the column titled "Memory Content after incr (binary)". The block "Memory Read" has four columns 3, 2, 1, 0 each of which represents a byte of the memory. The number in a field represents the number of the write cycle that occurred to the respective memory allocation unit, i.e. the respective lower significant 7 bits of the bytes 0, 1, 2 and 3. This is similar for the block "Memory Write". For example, column "Memory Write 0" has a 1 in the third row. This means that the first write operation occurs at this step. Therefore, the memory content also shows the binary 1 as LSB. As indicated in the next row in column "Memory Read 0", the value 1 is read back from the memory, placed in a counter (i.e. the counter can also simply be set to the value read from the memory) and the counter is increased by one which results in a count value CNT+1=2. The value is written to the memory as indicated in column Memory Write 0 and shown in the memory content, where bits [0] and [1] become '0' and '1' respectively. The table does not show all steps. For example between the CNT+1=3 and the CNT+1=125, there is a gap. However, the first 128 write cycles are all performed at the lowest significant Byte 0, i.e. with bits [0] to [6]. CNT+1=128 has the binary value '1000

0000b', which means that bit [7] is to be set to one. As bit [7] is one of the fixed bits and used as indicator for a specific bit pattern (i.e. a change of memory locations) the memory allocation for byte 0 and byte 1 is changed. Only the fixed bit [7] remains in the same position. The 127 steps, or write cycles following the first 128 write cycles are then performed with the seven LSBs of byte 1. The write cycle counter in column "Memory Write 0" remains therefore at 128. The write cycle count in column "Memory Write 1" increased in each step, which means that now write cycles of byte 1 are used instead of the write cycles of byte 0. When CNT+1=256 bit fixed bit [7] toggles as 256 corresponds to 28='1 0000 0000b'. Therefore, byte 0 is used for the following write cycles and byte remains unchanged.

The MSB of 256=28='1 0000 0000b' does not fit into a single byte. Since the physical memory locations for bytes 0 and 1 are continuously exchanged, the MSB would have to be exchanged, too. However, this would require additional write cycles in bytes 0 and 1. Therefore, the MSB and further MSBs are stored byte 2 rather than in bytes 1 or 0. The value in byte 2 changes only every 256 steps and when CNT+1=32767, the number of write cycles for byte 2 is 127. In step CNT+1=32768=215='1000 0000 0000 0000b'. This means, that bit [7] of byte 2 or bit [15] of the memory content changes from 0 to 1. As bit [15] is fixed bit and used as indicator for a change of the bit pattern, the storage location for the LSBs of the count is changed to byte 2. Furthermore, the exchange of storage allocations each 128 or 127 steps, is now performed between byte 3 and byte 2 instead of byte 0 and byte 1 or byte 1 and byte 2. The MSB (and further MSBs), which has been store in byte 2 in step CNT+1=284 is now stored in byte 0.

It can be seen that approximately every 128 write cycles, the physical storage location of the count is changed to a different physical storage location of the memory, as the exchange control bit is toggled between 0 and 1. In between this periodic exchange, only the least significant bit of the count toggles. This means that the least significant bit is stored in a different part of the memory every 128 write cycles (although sometimes the position is changed after every 125, 126 or 127 write cycles). The exchange of storage location is further extended in a manner that each unit of 7 bits of a byte of the memory (each unit of the storage location) is used approximately the same number of times for an allocation unit of the count of a specific significance when the counter reaches the maximum count of 232–1.

Figure 3:
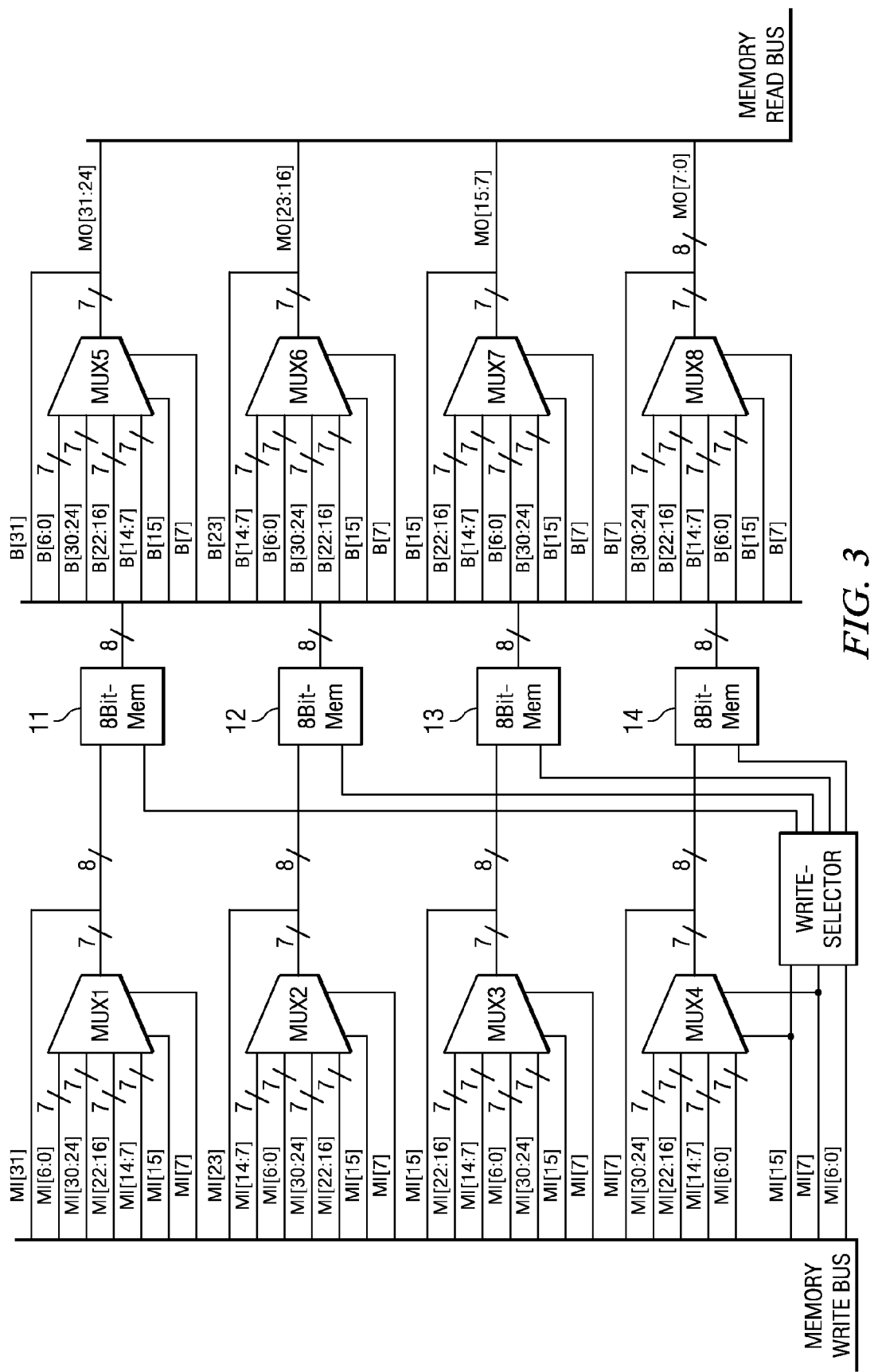
FIG. 3 is a simplified schematic of a memory in an electronic device according to the invention.

FIG. 3 schematically shows a memory for an electronic device according to the invention and is an example of how the exchange algorithm described above may be implemented in hardware. This hardware may be provided, for example, in an RFID tag, a car key or a vehicle locking system inside a car. Four memory cells 11, 12, 13 and 14 are connected to a memory write bus via multiplexers MUX1, MUX2, MUX3 and MUX4, respectively, and to a memory read bus via multiplexers MUX5, MUX6, MUX7 and MUX8, respectively. Each memory cell 11, 12, 13 and 14 is adapted to store one byte or allocation unit of the count. The counter writes the value of the count to the memory cells 11, 12, 13 and 14 via the multiplexers MUX1, MUX2, MUX3, and MUX4. The memory read bus then reads the stored value of the count from the memory cells 11, 12, 13 and 14 via the multiplexers MUX5, MUX6, MUX7 and MUX8, respectively. Each of the multiplexers MUX5, MUX6, MUX7 and MUX8 has an input corresponding to one allocation unit or byte of the count. The position of the allocation unit containing the least significant bit is stored in a different memory cell periodically after approximately every 128 write cycles. Each multiplexer MUX5, MUX6, MUX7 and MUX8 has two control inputs adapted to receive a control signal provided by the fixed bits B[15] and B[7] illustrated in FIG. 1. Depending on the binary value of the fixed bits B[15] and B[7], this indicates to the multiplexers MUX5, MUX6, MUX7 and MUX8 the location of the byte containing the least significant bit of the count, and thus where all other bytes of the count are located. Therefore each of the multiplexers MUX5, MUX6, MUX7 and MUX8 is controlled to select the correct input from the corresponding to the byte of the count stored in the corresponding memory cell 11, 12, 13 or 14.

Although the invention has been described hereinabove with reference to specific embodiments, it is not limited to these embodiments, and no doubt further alternatives will occur to the skilled person that lie within the scope of the invention as claimed.

What is claimed is:

1. A method for writing a binary count of a length n, wherein n is an integer greater than or equal to 1 that represents the total bits of the binary count, to a memory having a limited number of write cycles, the method comprising:
   periodically changing a physical storage location of bits (R-bits) of the count in the memory;
   storing fixed bits of the count at fixed physical storage locations, wherein the binary count is represented by the combination of the R-bits and the fixed bits; and
   using a bit value pattern of the fixed bits as an indicator for the physical storage locations of the changing bits (R-bits) to retrieve the binary count.

2. The method according to claim 1, wherein the number of fixed bits is equal to or greater than the logarithm to the base of two of the number of different position patterns of the changing bits over the whole count.

3. The method according to claim 1, wherein the changing bits are grouped in at least two allocation units and the changing is performed with the entire allocation units.

4. The method according to claim 2, wherein the changing bits are grouped in at least two allocation units and the changing is performed with the entire allocation units.

5. The method according to claim 2, wherein the lowest significant fixed bit has a significance within the count which is greater than the logarithm to the base of two of the number of different patterns.

6. The method according to claim 3, wherein the lowest significant fixed bit has a significance within the count which is greater than the logarithm to the base of two of the number of different patterns.

7. The method according to claim 1, wherein the count has a bit length of n=32.

8. The method according to claim 7, wherein the length of an allocation unit is 7 bit.

9. The method according to claim 8, wherein the fixed bits are the bits on positions 7, 15, 23, and 31.

10. The method according to claim 9, wherein the bit pattern of the fixed bits at positions 7 and 15 are used to indicate the respective physical storage locations of the allocation units.

11. The method according to claim 1, wherein the physical storage location of the bits (R-bits) is changed approximately substantially every 128 write cycles of the memory.

12. An electronic device having circuitry for writing a binary count of a length n, wherein n is an integer greater than or equal to 1 that represents the total bits of the binary count, to a memory with a limited number of write cycles comprising:
   a circuit for periodically changing physical storage locations of bits (R-bits) of the count stored in the memory and to write fixed bits of the count to fixed physical storage locations, wherein the binary count is represented by the combination of the R-bits and the fixed bits; and circuitry to use a bit value pattern of the fixed bits as an indicator for the position of the respective physical storage locations of the changing bits (R-bits) to retrieve the binary count.

13. The device according to claim 12, wherein the number of fixed bits is equal to or greater than the logarithm to the base of two of the number of different position patterns of the changing bits over the whole count.

14. The device according to any one of claim 12, further comprising using the fixed bits as control signals for a multiplexer.

15. An RFID tag, comprising:
an electronic device having circuitry for writing a binary count of a length n, wherein n is an integer greater than or equal to 1 that represents the total bits of the binary count, to a memory with a limited number of write cycles;
circuitry for periodically changing physical storage locations of bits (R-bits) of the count stored in the memory and to write fixed bits of the count to fixed physical storage locations, wherein the binary count is represented by the combination of the R-bits and the fixed bits; and
circuitry for using a bit value pattern of the fixed bits as an indicator for the position of the respective physical storage locations of the changing bits (R-bits) to retrieve the binary count.

16. An RFID system comprising the RFID tag of claim 15 and a read/write unit adapted to be in communication with the RFID tag.

17. A vehicle locking system, comprising:
an electronic device having circuitry for writing a binary count of a length n, wherein n is an integer greater than or equal to 1 that represents the total bits of the binary count, to a memory with a limited number of write cycles;
circuitry for periodically changing physical storage locations of bits (R-bits) of the count stored in the memory and to write fixed bits of the count to fixed physical storage locations, wherein the binary count is represented by the combination of the R-bits and the fixed bits; and
circuitry for using a bit value pattern of the fixed bits as an indicator for the position of the respective physical storage locations of the changing bits (R-bits) to retrieve the binary count.

18. The vehicle locking system according to claim 16, wherein the electronic device is located in a key for locking the vehicle such that the vehicle can only be opened when the count stored in the memory of the device in the key is within a predefined range to the count stored in the memory of the device in the vehicle.

19. The electronic device of claim 12, wherein the device is a car key.

20. A method of configuring an electronic device for writing a binary count of a length n, wherein n is an integer greater than or equal to 1 that represents the total bits of the binary count, to a memory with a limited number of write cycles, the method comprising:
providing a counter;
providing a memory and circuitry for writing the binary count from the counter to the memory;
coupling the counter and the memory to the circuitry;
adapting the circuitry to be capable of periodically changing physical storage locations of bits (R-bits) of the count stored in the memory and to write fixed bits of the count to fixed physical storage locations, wherein the binary count is represented by the combination of the R-bits and the fixed bits; and
adapting the circuitry to be able to use a bit value pattern of the fixed bits as an indicator for the position of the respective physical storage locations of the changing bits to retrieve the binary count.

* * * * *